(12) United States Patent
Bartley et al.

(10) Patent No.: US 7,882,479 B2
(45) Date of Patent: *Feb. 1, 2011

(54) METHOD AND APPARATUS FOR IMPLEMENTING REDUNDANT MEMORY ACCESS USING MULTIPLE CONTROLLERS ON THE SAME BANK OF MEMORY

(75) Inventors: Gerald Keith Bartley, Rochester, MN (US); Darryl John Becker, Rochester, MN (US); John Michael Borkenhagen, Rochester, MN (US); Paul Eric Dahlen, Rochester, MN (US); Philip Raymond Germann, Oronoco, MN (US); William Paul Hovis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 643 days.

This patent is subject to a terminal disclaimer.

(21) Appl. No.: 11/872,191

(22) Filed: Oct. 15, 2007

(65) Prior Publication Data
US 2008/0307253 A1   Dec. 11, 2008

Related U.S. Application Data

(63) Continuation-in-part of application No. 11/758,732, filed on Jun. 6, 2007, now Pat. No. 7,725,762.

(51) Int. Cl.
*G06F 17/50* (2006.01)

(52) U.S. Cl. .................... 716/18; 716/1; 716/2; 716/11

(58) Field of Classification Search .................... 716/1, 716/2, 11, 18
See application file for complete search history.

(56) References Cited

U.S. PATENT DOCUMENTS

| | | | |
|---|---|---|---|
| 5,379,415 A | 1/1995 | Papenberg et al. | |
| 5,896,492 A | 4/1999 | Chong, Jr. | |
| 6,243,829 B1 | 6/2001 | Chan | |
| 6,802,023 B2 * | 10/2004 | Oldfield et al. | 714/7 |
| 6,854,043 B2 | 2/2005 | Hargis et al. | |
| 6,978,397 B2 | 12/2005 | Chan | |
| 2001/0016920 A1 | 8/2001 | Chan | |
| 2002/0133740 A1 | 9/2002 | Oldfield et al. | |
| 2002/0133743 A1 | 9/2002 | Oldfield et al. | |

* cited by examiner

*Primary Examiner*—Thuan Do
(74) *Attorney, Agent, or Firm*—Joan Pennington

(57) ABSTRACT

A method and apparatus implement redundant memory access using multiple controllers on the same bank of memory, and a design structure on which the subject circuit resides is provided. A first memory controller uses the memory as its primary address space, for storage and fetches. A second redundant controller is also connected to the same memory. System control logic is used to notify the redundant controller of the need to take over the memory interface. The redundant controller initializes if required and takes control of the memory. The memory only needs to be initialized if the system has to be brought down and restarted in the redundant mode. This invention allows the system to continue to stay up and continue running during a memory controller or link failure.

13 Claims, 9 Drawing Sheets

METHOD AND APPARATUS FOR IMPLEMENTING REDUNDANT MEMORY ACCESS USING MULTIPLE CONTROLLERS ON THE SAME BANK OF MEMORY

This application is a continuation-in-part application of Ser. No. 11/758,732 filed on Jun. 6, 2007.

FIELD OF THE INVENTION

The present invention relates generally to the data processing field, and more particularly, relates to a method and apparatus for implementing redundant memory access using multiple controllers on the same bank of memory or a common memory, and a design structure on which the subject circuit resides.

DESCRIPTION OF THE RELATED ART

In today's server systems, the loss of data in a component or power failure can be devastating to a business' operations. The ability to fail-over components of the server system and applications is critical to the successful implementation of multi-processor systems.

Conventional processor-to-memory architectures utilize data coherency models that require each processor to have a single access point to either its own dedicated memory, or a bank of memory shared among many processors.

In the case where each processor is given a dedicated memory space, a failure of the processor can lead to the loss of data, both in the on-chip caches, and in the mainstore memory.

A need exists for an effective mechanism that enables implementing redundant memory access using multiple controllers on the same bank of memory.

SUMMARY OF THE INVENTION

Principal aspects of the present invention are to provide a method and apparatus for implementing redundant memory access using multiple controllers on the same bank of memory, and a design structure on which the subject circuit resides. Other important aspects of the present invention are to provide such method and apparatus for implementing redundant memory access substantially without negative effect and that overcome many of the disadvantages of prior art arrangements.

In brief, a method and apparatus for implementing redundant memory access, and a design structure on which the subject circuit resides are provided. A memory is connected to multiple memory controllers. A first memory controller uses the memory as its primary address space, for storage and fetches. A second redundant controller is also connected to the same memory. System control logic is used to notify the redundant controller of the need to take over the memory interface. The redundant controller initializes and takes control of the memory.

In accordance with features of the invention, the redundant controller does not use the memory as primary storage, for example, to avoid coherency issues. The redundant controller can be connected to a different memory for normal operation.

In accordance with features of the invention, the redundant controller can be a spare, unused component during normal operation. During failover, the redundant controller takes over the connection to the memory to continue the application or process that was running, or to export the data from the memory to another location.

In accordance with features of the invention, the redundant controller can be part of a multi-processor system, contributing cycles to the workload of the overall system during normal operation.

In accordance with features of the invention, when the first controller encounters a fail condition and cannot access the memory, then the redundant controller is activated to access the common memory while remaining inactive until needed.

In accordance with features of the invention, the memory includes dynamic random access memory (DRAM), arranged, for example, as dual inline memory module (DIMM) circuit cards.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and apparatus enable implementing redundant memory access using multiple controllers on the same bank of memory. The present invention enables access to memory data through a redundant path. The redundant controller is activated to access the common memory after either a memory controller failure or an interconnect or link failure to the common memory. The redundant memory controller supports redundant data/address/control interconnect paths to the memory. The first controller uses the memory as its primary address space, for storage and fetches. The second and/or third redundant controller is also connected to the same memory bank, but does not use this memory as primary storage. The second controller can be connected to a different memory system for normal operation. The redundant controller can be either a spare, unused component during normal operation, or it can be part of a multi-processor system, contributing cycles to the workload of the overall system.

In accordance with features of the invention, after a failure of either the first controller or link to the common memory, the redundant controller initializes, if needed, and takes control of the common memory. The memory only needs to be initialized if the system has to come down. This invention allows the system to continue running following a memory controller or link failure. Typically the system does not have to be brought down and restarted in the redundant or failover mode.

Figure 1:
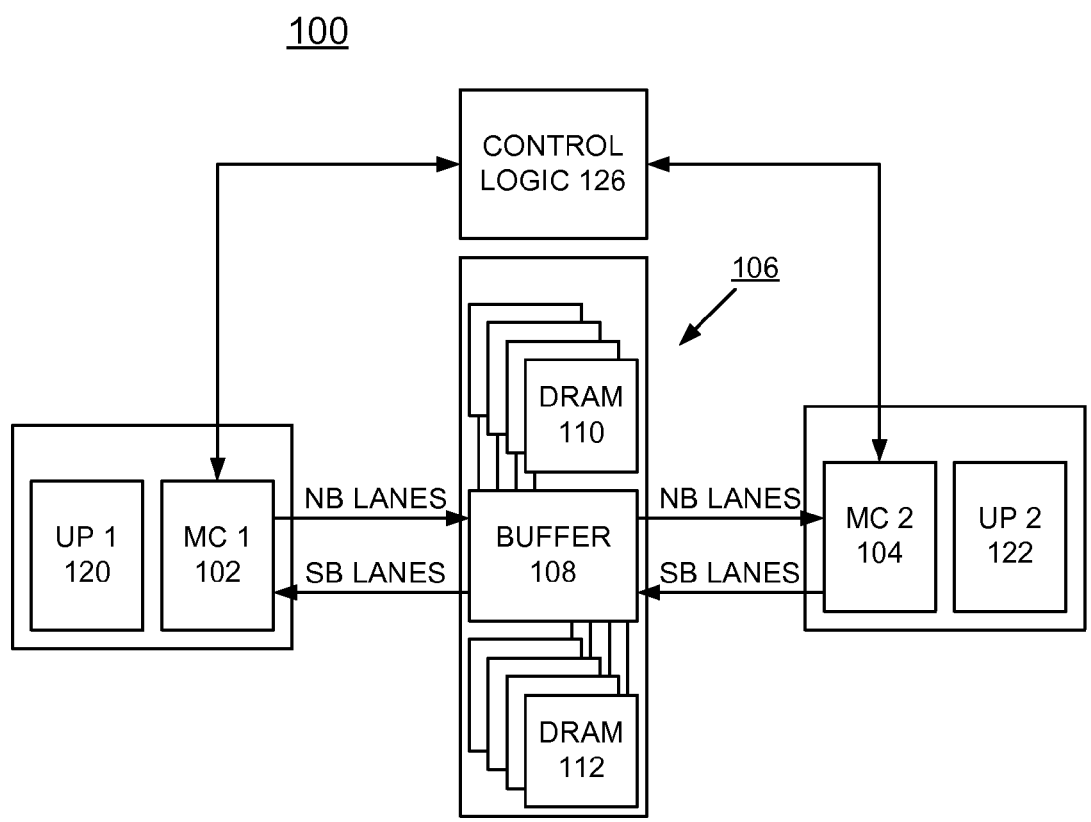
FIG. 1 is block diagram representation illustrating an exemplary memory system in accordance with the preferred embodiment.

Having reference now to the drawings, in FIG. 1, there is shown an exemplary memory system generally designated by the reference character 100 in accordance with the preferred embodiment. Memory system 100 is for example, a dynamic random access memory (DRAM) system 100. DRAM system 100 includes a first memory controller (MC 1) 102 and a second redundant memory controller (MC 2) 104.

Each of the memory controllers MC 1, MC 2, 102, 104 is connected to a memory generally designated by the reference character 106 via northbound (NB) and southbound (SB) lanes. Memory 106 includes a buffer 108 coupled to a plurality of DRAMs 110, 112, arranged, for example, as dual inline memory module (DIMM) circuit cards.

Each of the memory controllers MC 1, MC 2, 102, 104 is physically included with a respective processor 120, 122 within a processor package or system in a package (SIP). A control logic circuit 126 is connected to each of the memory controllers MC 1, MC 2, 102, 104. The control logic circuit 126 is provided to notify the second redundant controller MC 2, 104 of the need to take over the memory interface of memory 106.

In the memory system 100, the first memory controller MC 1, 102 uses the plurality of DRAMs 110, 112 of the buffered memory 106 as its primary address space for storage and fetches. The redundant controller MC 2, 104 normally does not use the plurality of DRAMs 110, 112 of the buffered memory 106 as primary storage.

When the first memory controllers MC 1, 102 encounters a fail condition and cannot access the memory 106, then the redundant controller MC 2, 104 is activated to access the common memory plurality of DRAMs 110, 112 of the buffered memory 106. During failover, typically the redundant controller MC 2, 104 enables the memory system 100 to stay up and continue running. The redundant memory controller MC 2, 104 supports redundant data/address/control interconnect paths to the common memory plurality of DRAMs 110, 112 of the buffered memory 106. During failover, the redundant controller MC 2, 104 takes over the connection to the memory 106, for example, to continue the application or process that was running before the fail condition, or to export the data from the memory 106 to another location.

It should be understood that the present invention is not limited to the illustrated arrangement of memory system 100. For example, multiple buffered DIMM circuit cards can be arranged inline. Such an inline multiple buffered DIMM circuit card arrangement is analogous to a daisy-chained DRAM arrangement illustrated and described with respect to FIG. 4.

Figure 2:
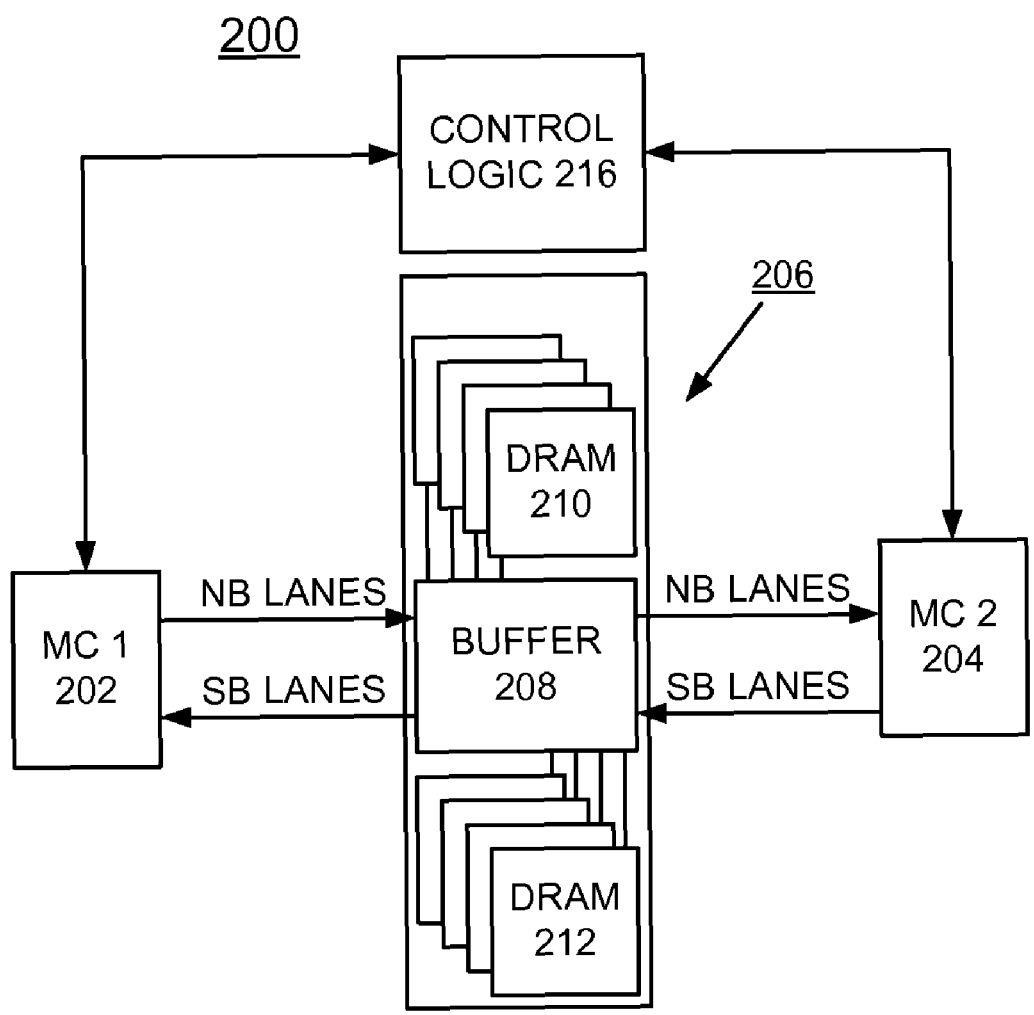
FIGS. 2, and 3 respectively illustrate an alternative exemplary memory system during normal operation and operation of the alternative exemplary memory system with a failed first controller or failed link to memory in accordance with a preferred embodiment.
Figure 3:
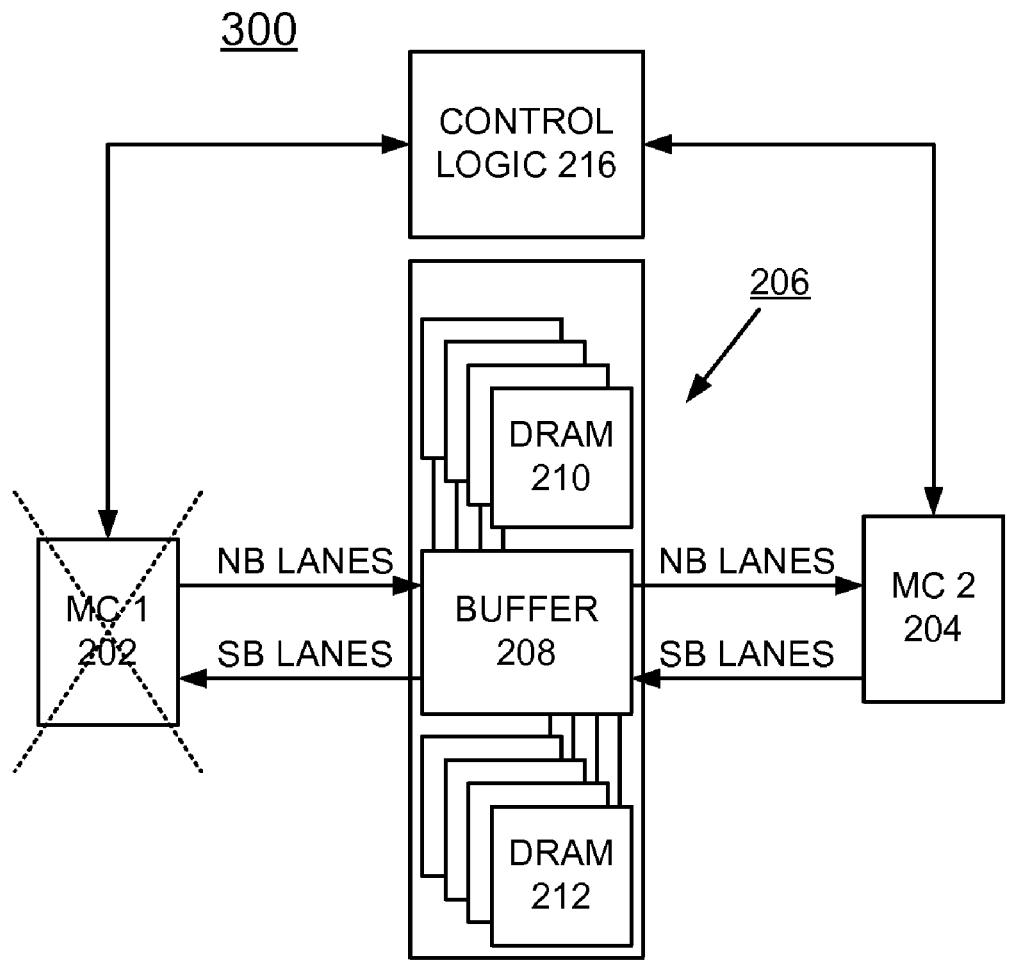

Referring to FIGS. 2 and 3 there is shown an alternative exemplary memory system generally designated by the reference character 200 in accordance with the preferred embodiment. Memory system 200 is shown during normal operation in FIG. 2 with a first memory controller MC 1 202 and a second redundant memory controller MC 2 204 connected to a memory 206 via northbound (NB) and southbound (SB) lanes. Memory 206 includes a buffer 208 coupled to a plurality of DRAMs 210, 212, arranged, for example, as dual inline memory module (DIMM) circuit cards. A control logic circuit 216 is connected to each of the memory controllers MC 1, MC 2, 202, 204 and notifies the second redundant controller MC 2, 204 of the need to take over the memory 206.

In the memory system 200, the first memory controller MC 1, 202 uses the plurality of DRAMs 210, 212 of the buffered memory 206 as its primary address space for storage and fetches. The redundant controller MC 2, 204 normally does not use the plurality of DRAMs 210, 212 of the buffered memory 206 as primary storage. The redundant memory controller MC 2, 204 is inactive until needed when the primary memory controller MC 1, 202 or link fails to the buffered memory 206.

It should be understood that the present invention is not limited to the redundant memory controller MC 2, 204 being inactive until needed with a fail condition. For example, the redundant memory controller MC 2, 204 can be active using a separate memory (not shown) as its primary address space for storage and fetches during normal operation.

FIG. 3 illustrates operation of the memory system 200 with a failed first controller MC 1 202 and the redundant memory controller MC 2, 204 is activated to access and control the common memory 206. During failover, typically the redundant controller MC 2, 204 enables the memory system 200 to stay up and continue running. The redundant memory controller MC 2, 204 supports redundant data/address/control interconnect paths to the common memory 206. During failover, the redundant controller MC 2, 204 continues the application or process use of memory 206 that was running before the fail condition, or exports the data from the memory 206 to another location.

Figure 4:
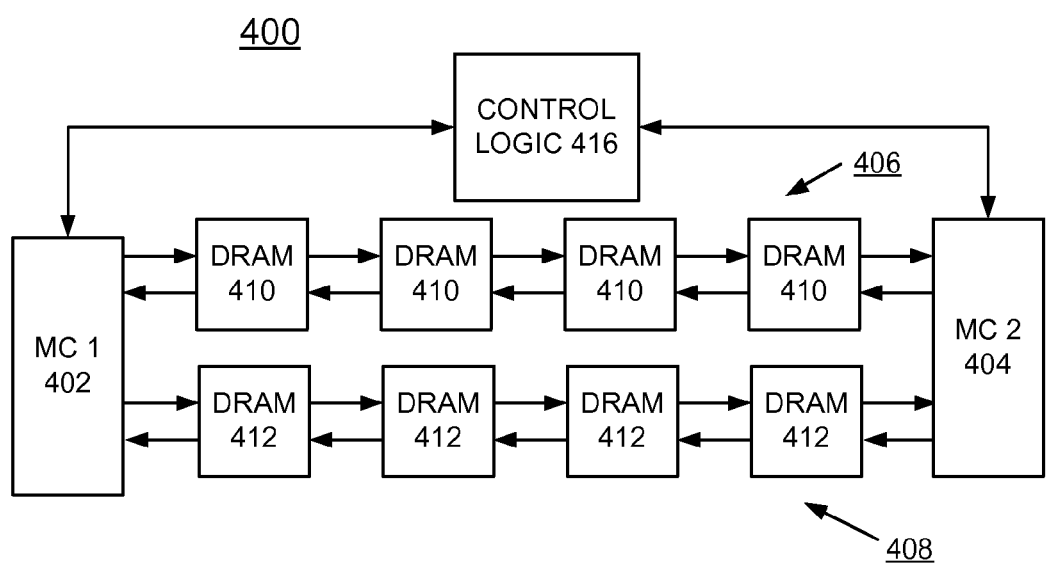
FIGS. 4, and 5 respectively illustrate another alternative exemplary memory system and operation of the alternative exemplary memory system with a failed first controller or failed link to memory in accordance with a preferred embodiment.
Figure 5:
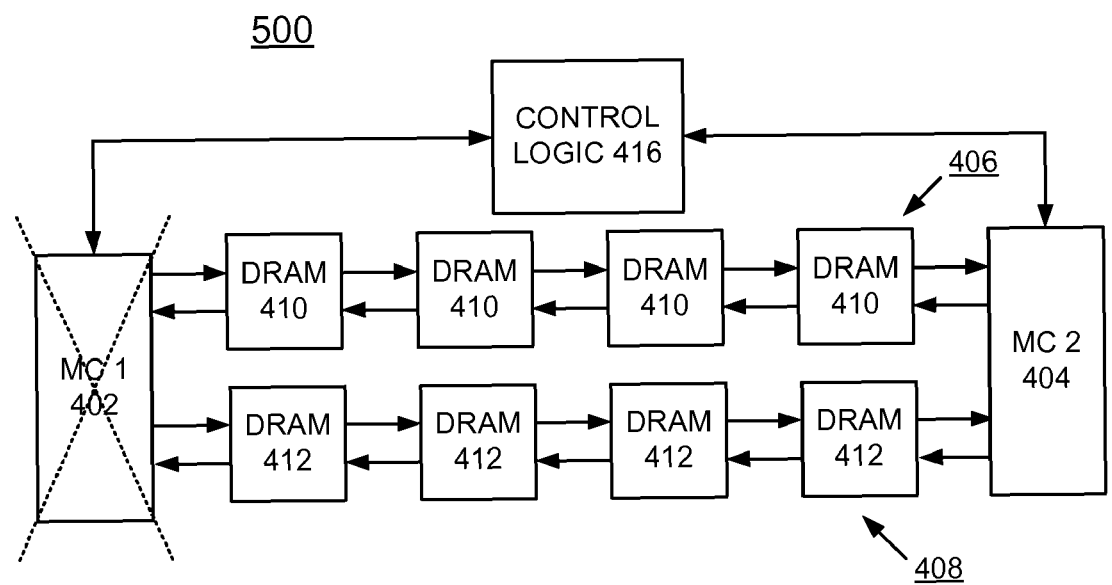

Referring to FIGS. 4 and 5 there is shown an alternative exemplary memory system generally designated by the reference character 400 in accordance with a preferred embodiment. Memory system 400 is shown during normal operation in FIG. 4 with a first memory controller MC 1, 402 and a second redundant memory controller MC 2, 404 connected to a first daisy chain memory 406 and a second daisy chain memory 408. Each of the first and second daisy chain memories 406, 408 respectively includes a plurality of DRAMs 410, and a plurality of DRAMs 412. A control logic circuit 416 is connected to each of the memory controllers MC 1, MC 2, 402, 404 and notifies the second redundant controller MC 2, 404 of the need to take over the memory 406, 408. The redundant memory controller MC 2, 404 can be inactive until needed when the primary memory controller MC 1, 402 or link to the buffered memory 406 fails.

It should be understood that the present invention is not limited to the redundant memory controller MC 2, 404 being inactive until needed with the fail condition. For example, the redundant memory controller MC 2, 404 can be active using a separate memory (not shown) as its primary address space for storage and fetches during normal operation.

FIG. 5 illustrates operation of the memory system 400 with a failed first controller MC 1, 402 and the redundant memory controller MC 2, 404 is activated to access and control the first and second daisy chain memory 406, 408. During failover, typically the redundant controller MC 2, 404 enables the memory system 400 to stay up and continue running. The redundant memory controller MC 2, 404 supports redundant data/address/control interconnect paths to the common first and second daisy chain memory 406, 408. During failover, the redundant controller MC 2, 404 continues the application or process use of memories 406, 408 that was running before the fail condition, or exports the data from the memories 406, 408 to another location.

Figure 6:
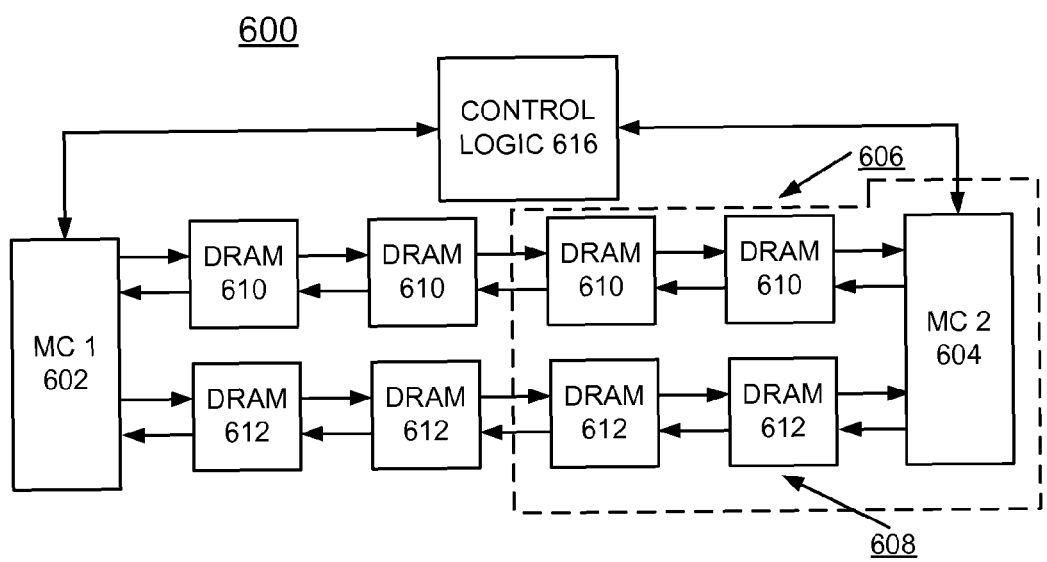
FIGS. 6 and 7 respectively illustrate an alternative exemplary memory system and operation of the alternative exemplary memory system with a failed first controller or failed link to memory in accordance with a preferred embodiment.
Figure 7:
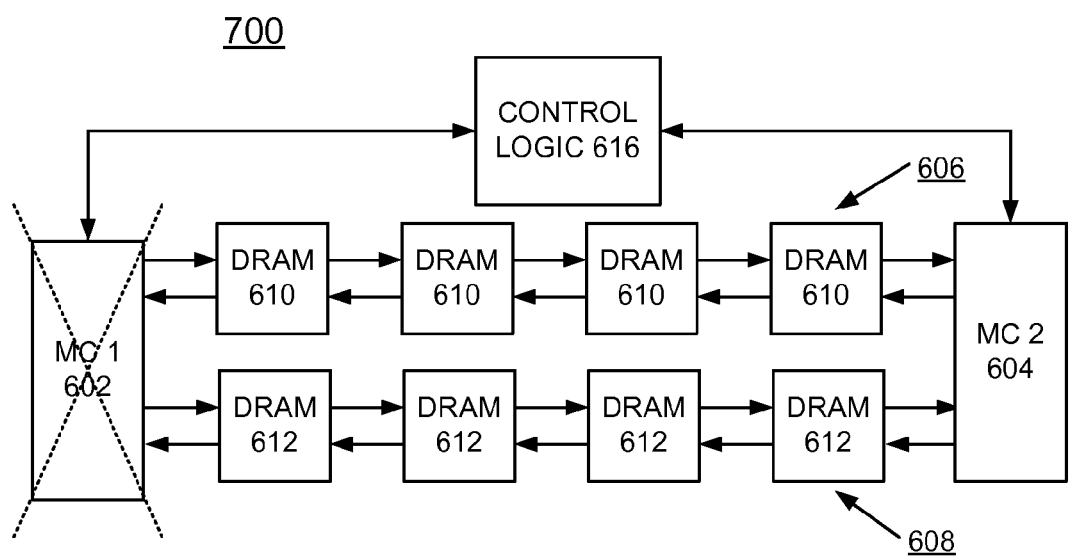

Referring to FIGS. 6 and 7 there is shown another alternative exemplary memory system generally designated by the reference character 600 in accordance with a preferred embodiment. Memory system 600 is shown during normal operation in FIG. 6 with both a first memory controller MC 1, 602 and a second redundant memory controller MC 2, 604 connected to a first daisy chain memory 606 and connected to a second daisy chain memory 608. The first memory daisy chain 606 and the second memory daisy chain 608, respectively includes a plurality of DRAMs 610 and a plurality of 612.

During normal operation, the first memory controller MC 1 602 uses an adjacent or left pair of DRAMs 610 of the first daisy chain memory 606 and a left pair of DRAMs 612 of the second daisy chain memory 608 as its primary address space for storage and fetches. As indicated by dotted line in FIG. 6, the second redundant memory controller MC 2, 604 is active using an adjacent or right pair of DRAMs 610 of the first daisy chain memory 606 and a right pair of DRAMs 612 of the second daisy chain memory 608 as its primary address space for storage and fetches during normal operation.

A control logic circuit 616 is connected to each of the memory controllers MC 1, MC 2, 602, 604 and notifies the second redundant controller MC 2, 604 of the need to take over the left pair of DRAMs 610 of the first daisy chain memory 606 and the left pair of DRAMs 612 of the second daisy chain memory 608. The redundant memory controller MC 2, 604 is active and uses the adjacent or right pair of DRAMs 610 of the first daisy chain memory 606 and the right pair of DRAMs 612 of the second daisy chain memory 608 until needed when the primary memory controller MC 1, 602 fails or the associated memory link fails.

FIG. 7 illustrates operation of the memory system 600 with a failed first controller MC 1 602 or failed link to the left pair of DRAMs 610 of the first daisy chain memory 606 or the left pair of DRAMs 612 of the second daisy chain memory 608. Then the redundant memory controller MC 2, 604 is activated to also access all of the DRAMs 610, 612 in the first and second daisy chain memories 606, 608. During failover, typically the redundant controller MC 2, 604 enables the memory system 600 to stay up and continue running. The redundant memory controller MC 2, 604 supports redundant data/address/control interconnect paths to the DRAMs 610, 612 in the first and second daisy chain memories 606, 608. During failover, the redundant controller MC 2, 604 continues the application or process use of the left pair of DRAMs 610 of the first daisy chain memory 606 and the left pair of DRAMs 612 of the second daisy chain memory 608 that was running before the fail condition, or exports the data from both the left pair of DRAMs 610 of the first daisy chain memory 606 and the left pair of DRAMs 612 of the second daisy chain memory 608 to another location.

It should be understood that operation of the memory system 600 advantageously is implemented so that with a failed second controller MC 2, 604, the first memory controller MC 1, 602 is activated to also access the right pair of DRAMs 610 of the first daisy chain memory 606 and the right pair of DRAMs 612 of the second daisy chain memory 608. During failover, typically the redundant first controller MC 1, 602 also enables the memory system 600 to stay up and continue running. The redundant first controller MC 1, 602 supports redundant data/address/control interconnect paths to the right pair of DRAMs 610 of the first daisy chain memory 606 and the right pair of DRAMs 612 of the second daisy chain memory 608. During failover, the redundant first controller MC 1, 602 continues the application or process use of right pair of DRAMs 610 of the first daisy chain memory 606 and the right pair of DRAMs 612 of the second daisy chain memory 608 that was running before the fail condition, or exports the data from both the right pair of DRAMs 610 of the first daisy chain memory 606 and the right pair of DRAMs 612 of the second daisy chain memory 608 to another location.

Figure 8:
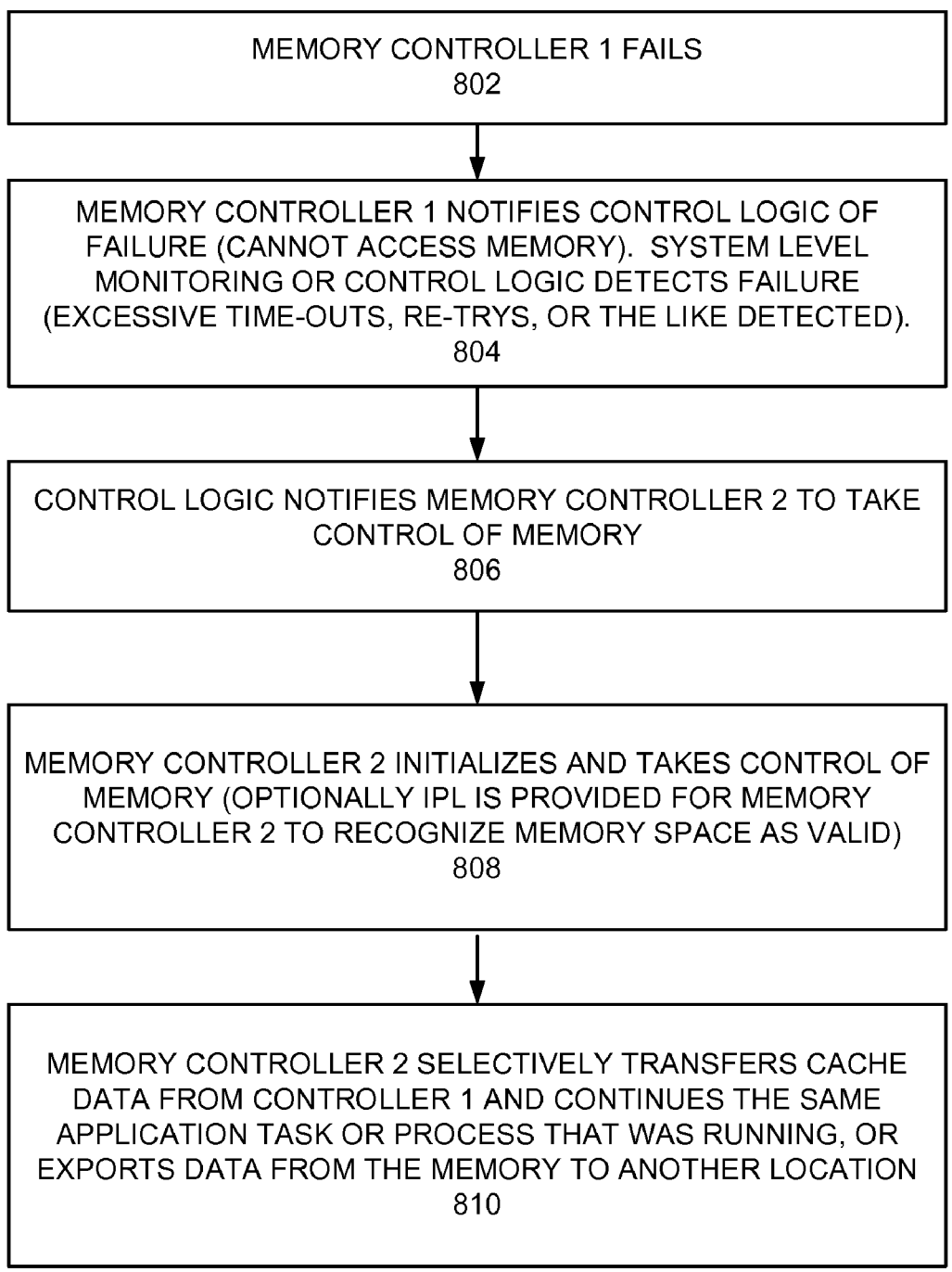
FIG. 8 illustrates exemplary steps performed by each exemplary memory system in accordance with the preferred embodiment.

Exemplary operation of the memory system 100, memory system 200, memory system 400, and memory system 600 is illustrated and described with respect to the exemplary steps shown in the flow chart of FIG. 8.

Referring now to FIG. 8, there are shown exemplary steps performed by each exemplary memory system 100, 200, 400, 600 in accordance with the preferred embodiment. As indicated at a block 802, a first memory controller 1 fails or is not able to access a common memory. The first memory controller 1 notifies control logic of the failure as indicated at a block 804. Also system level monitoring or control logic can detect the failure at block 804. Control logic notifies the redundant memory controller 2 to take control of the memory that the first memory controller 1 is not able to access as indicated at a block 806. Then the redundant controller 2 initializes and is activated to access and take control of the common memory as indicated at a block 808. Optionally during failover, if the second redundant controller has not already been initialized to access the memory space, an initial program load (IPL) is performed in order for the redundant controller 2 to recognize the new memory space as valid. Then the redundant controller 2 takes over the memory, to either continue the application or process that was running, or to export the data from the memory to another location as indicated at a block 810.

Figure 9:
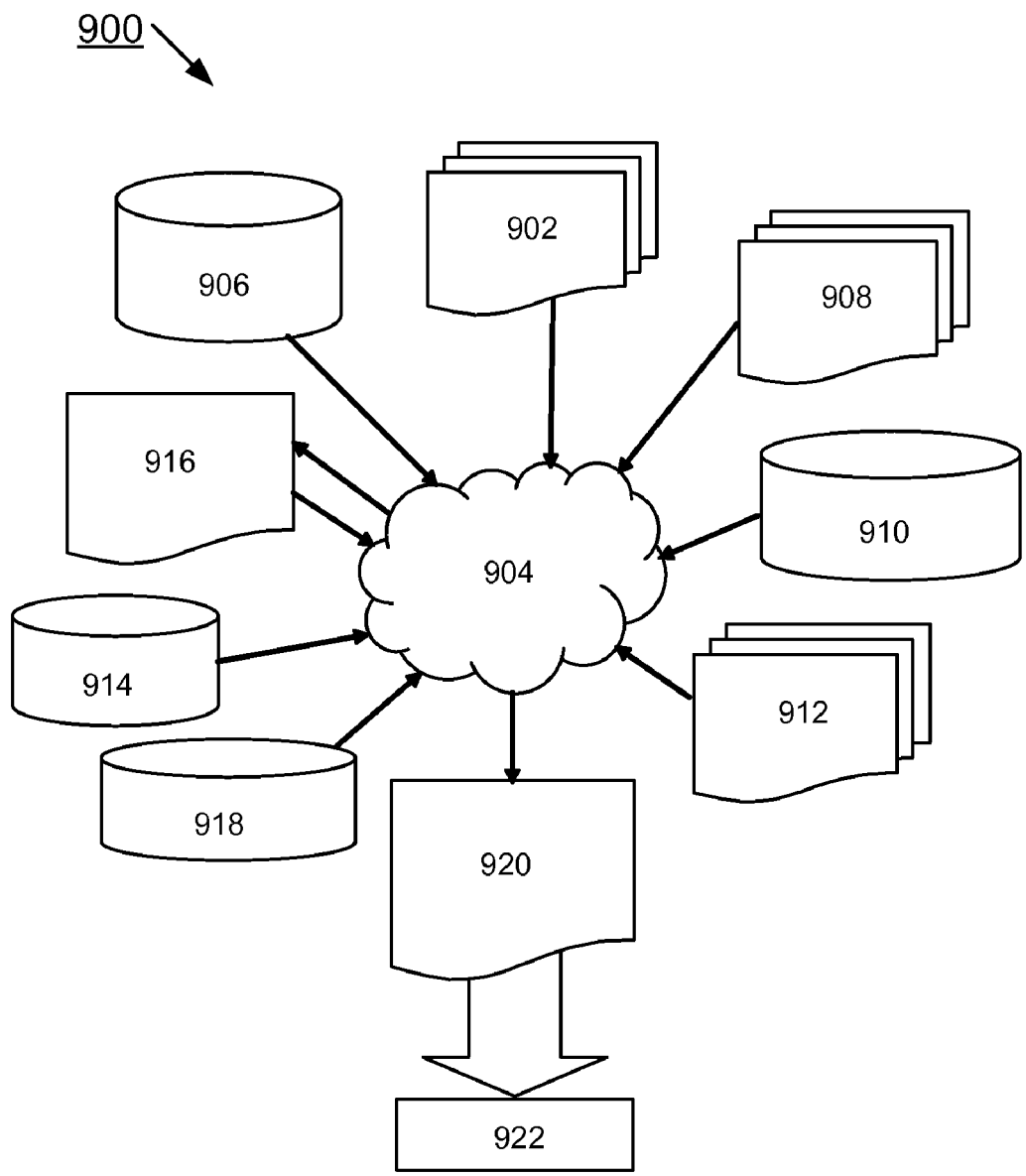
FIG. 9 is a flow diagram of a design process used in semiconductor design, manufacturing, and/or test.

FIG. 9 shows a block diagram of an example design flow 900. Design flow 900 may vary depending on the type of IC being designed. For example, a design flow 900 for building an application specific IC (ASIC) may differ from a design flow 900 for designing a standard component. Design structure 902 is preferably an input to a design process 904 and may come from an IP provider, a core developer, or other design company or may be generated by the operator of the design flow, or from other sources. Design structure 902 comprises circuits 100, 200, 300, 400, 500, 600, 700 in the form of schematics or HDL, a hardware-description language, for example, Verilog, VHDL, C, and the like. Design structure 902 may be contained on one or more machine readable medium. For example, design structure 902 may be a text file or a graphical representation of circuits 100, 200, 300, 400, 500, 600, 700. Design process 904 preferably synthesizes, or translates, circuits 100, 200, 300, 400, 500, 600, 700 into a netlist 906, where netlist 906 is, for example, a list of wires, transistors, logic gates, control circuits, I/O, models, etc. that describes the connections to other elements and circuits in an integrated circuit design and recorded on at least one of machine readable medium. This may be an iterative process in which netlist 906 is resynthesized one or more times depending on design specifications and parameters for the circuits.

Design process 904 may include using a variety of inputs; for example, inputs from library elements 908 which may house a set of commonly used elements, circuits, and devices, including models, layouts, and symbolic representations, for a given manufacturing technology, such as different technology nodes, 32 nm, 45 nm, 90 nm, and the like, design specifications 910, characterization data 912, verification data 914, design rules 916, and test data files 918, which may include test patterns and other testing information. Design process 904 may further include, for example, standard circuit design processes such as timing analysis, verification, design rule checking, place and route operations, and the like. One of ordinary skill in the art of integrated circuit design can appreciate the extent of possible electronic design automation tools and applications used in design process 904 without deviating from the scope and spirit of the invention. The design structure of the invention is not limited to any specific design flow.

Design process 904 preferably translates an embodiment of the invention as shown in FIGS. 1-7 along with any additional integrated circuit design or data (if applicable), into a second design structure 920. Design structure 920 resides on a storage medium in a data format used for the exchange of layout data of integrated circuits, for example, information stored in a GDSII (GDS2), GL1, OASIS, or any other suitable format for storing such design structures. Design structure 920 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-7. Design structure 920 may then proceed to a stage 922 where, for example, design structure 920 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A design structure embodied in a machine readable medium used in a design process, the design structure comprising:

a circuit for implementing redundant memory access tangibly embodied in the machine readable medium used in the design process, said circuit including a memory;

said memory including a dynamic random access memory (DRAM); said dynamic random access memory (DRAM) including a first daisy chain memory and a second daisy chain memory;

a first memory controller coupled to said memory; said first memory controller using said memory as a primary address space for storage and fetches;

a second redundant memory controller coupled to said memory;

system control logic coupled to said first memory controller and said second redundant memory controller; said system control logic notifying said second redundant memory controller to take control of said memory; and said second redundant memory controller initializing and taking control of said memory responsive to being notified by said system control logic; and said first memory controller using said first daisy chain memory and said second daisy chain memory as a primary address space for storage and fetches during normal operation; and said first daisy chain memory and said second daisy chain memory is not used by said second redundant memory controller during normal operation; wherein the design structure, when read and used in the manufacture of a semiconductor chip produces a chip comprising said circuit.

2. The design structure of claim 1, wherein the design structure comprises a netlist, which describes the circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. The design structure of claim 1, wherein said dynamic random access memory (DRAM) is arranged as dual inline memory module (DIMM) circuit cards.

6. The design structure of claim 5 includes a buffer coupled between said memory and said first memory controller and said second redundant memory controller, and said dynamic random access memory (DRAM) is arranged as buffered memory with multiple DIMM circuit cards.

7. The design structure of claim 6, wherein said buffered memory with multiple DIMM circuit cards is not used by said second redundant memory controller during normal operation.

8. The design structure of claim 1, wherein said second redundant memory controller is used with another separate memory during normal operation.

9. The design structure of claim 1, wherein during normal operation said first memory controller uses a portion of said first daisy chain memory and said second daisy chain memory as a primary address space for storage and fetches and said second redundant memory controller uses another portion of said first daisy chain memory and said second daisy chain memory as a primary address space for storage and fetches.

10. The design structure of claim 1, wherein said second redundant memory controller continues operation of an application or process that was running before a failover condition.

11. The design structure of claim 1, wherein said second redundant memory controller exports data from said memory to another location responsive to a failover condition.

12. The design structure of claim 1, wherein at least one of said first memory controller and said second redundant memory controller includes an integrated microprocessor and memory controller.

13. The design structure of claim 12, wherein said integrated microprocessor and memory controller includes a processor system in a package (SIP).

* * * * *